(12) United States Patent
Ichinokura et al.

(10) Patent No.: US 10,811,570 B2
(45) Date of Patent: Oct. 20, 2020

(54) SEMICONDUCTOR LIGHT-EMITTING DEVICE AND METHOD FOR MANUFACTURING THE SAME

(71) Applicant: NIKKISO CO., LTD., Tokyo (JP)

(72) Inventors: Hiroyasu Ichinokura, Ishikawa (JP); Shoichi Niizeki, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/257,154

(22) Filed: Jan. 25, 2019

(65) Prior Publication Data

US 2019/0237631 A1 Aug. 1, 2019

(30) Foreign Application Priority Data

Jan. 31, 2018 (JP) .................................. 2018-015853

(51) Int. Cl.
*H01L 33/48* (2010.01)
*H01L 23/10* (2006.01)
*H01L 23/00* (2006.01)
*B23K 35/26* (2006.01)
*C22C 13/00* (2006.01)
(Continued)

(52) U.S. Cl.
CPC .......... *H01L 33/486* (2013.01); *B23K 35/262* (2013.01); *C22C 13/00* (2013.01); *H01L 23/10* (2013.01); *H01L 23/3142* (2013.01); *H01L 23/562* (2013.01); *H01L 33/62* (2013.01); *B23K 2101/40* (2018.08); *H01L 2933/0033* (2013.01); *H01L 2933/0066* (2013.01)

(58) Field of Classification Search
CPC ... H01L 33/486; H01L 33/62; H01L 23/3142; H01L 23/10; H01L 23/562; B23K 35/262; C22C 13/00
See application file for complete search history.

(56) References Cited

U.S. PATENT DOCUMENTS

| 5,532,513 A | 7/1996 | Smith et al. |
| 5,821,617 A | 10/1998 | Autry et al. |

(Continued)

FOREIGN PATENT DOCUMENTS

| JP | 2002-075775 A | 3/2002 |
| JP | 2007-321191 A | 12/2007 |

(Continued)

OTHER PUBLICATIONS

Japanese Office Action dated Oct. 8, 2019 in Japanese Patent Application No. 2018-015853.
(Continued)

*Primary Examiner* — Joseph C. Nicely
(74) *Attorney, Agent, or Firm* — Scully, Scott, Murphy & Presser, P.C.

(57) ABSTRACT

A semiconductor light-emitting device includes a substrate on which a semiconductor light-emitting element is mounted, the substrate having a first coefficient of thermal expansion, a lid member that covers the semiconductor light-emitting element, the lid member having a second coefficient of thermal expansion smaller than the first coefficient of thermal expansion, and a joining member that joins the lid member to the substrate to seal the semiconductor light-emitting element. The joining member includes a eutectic alloy solder.

7 Claims, 8 Drawing Sheets

(51) Int. Cl.
*H01L 33/62* (2010.01)
*H01L 23/31* (2006.01)
*B23K 101/40* (2006.01)

(56) References Cited

U.S. PATENT DOCUMENTS

| | | | |
|---|---|---|---|
| 8,970,053 B2 | 3/2015 | Wang et al. | |
| 2004/0135247 A1* | 7/2004 | Takashima | B22F 3/26 257/720 |
| 2004/0191939 A1* | 9/2004 | Kon | H01L 33/0079 438/22 |
| 2008/0164467 A1* | 7/2008 | Sano | H01L 33/0079 257/43 |
| 2011/0051758 A1* | 3/2011 | Krejci | H01S 5/02272 372/34 |
| 2012/0250211 A1* | 10/2012 | Kida | H01L 21/6833 361/234 |
| 2013/0214310 A1 | 8/2013 | Wang et al. | |
| 2015/0076542 A1 | 3/2015 | Sung et al. | |
| 2016/0181290 A1* | 6/2016 | Wang | H01L 27/1225 257/43 |
| 2019/0189861 A1* | 6/2019 | Ichinokura | H01L 33/483 |
| 2019/0189862 A1* | 6/2019 | Ichinokura | H01L 23/02 |
| 2019/0189870 A1* | 6/2019 | Ichinokura | H01L 33/56 |

FOREIGN PATENT DOCUMENTS

| | | |
|---|---|---|
| JP | 2012-069977 A | 4/2012 |
| JP | 2015-018873 A | 1/2015 |
| TW | 201336031 | 9/2013 |
| TW | 201511350 | 3/2015 |

OTHER PUBLICATIONS

Taiwanese Office Action & Search Report dated Jun. 19, 2020 received in Taiwanese Invention Patent Application No. 108101320, together with an English-language translation.

* cited by examiner

SEMICONDUCTOR LIGHT-EMITTING DEVICE AND METHOD FOR MANUFACTURING THE SAME

CROSS-REFERENCE TO RELATED APPLICATIONS

The present application is based on Japanese patent application No. 2018-015853 filed on Jan. 31, 2018, the entire contents of which are incorporated herein by reference.

FIELD OF INVENTION

The invention relates to a semiconductor light-emitting device and a method for manufacturing the semiconductor light-emitting device.

BACKGROUND ART

In recent years, a semiconductor light-emitting device is proposed which includes a semiconductor light-emitting element that emits ultraviolet rays and a package that houses the semiconductor light-emitting element. In particular, a semiconductor light-emitting device having a semiconductor light-emitting element that emits deep ultraviolet light with a wavelength of not more than 300 nm uses a glass sealing package in which the semiconductor light-emitting element is sealed with a glass such as a silica glass (see PTL 1).

PTL 1 discloses a semiconductor light-emitting device in which an LED element is mounted on a package substrate, a glass lid with a phosphor mixed therein is covered on the LED element, and light emitted from the LED element is wavelength-converted. The package substrate is an inorganic material substrate such as a ceramics, the LED element is flip-chip mounted on the inorganic material substrate, and the LED element is sealed with the glass lid with the phosphor mixed therein.

CITATION LIST

Patent Literature

PTL 1: JP 2012/69977 A

SUMMARY OF INVENTION

Technical Problem

In the semiconductor light-emitting device disclosed in PTL 1, when the glass lid is formed of the silica glass, its coefficient of a thermal expansion is smaller by about one order of magnitude than a thermal expansion coefficient of an inorganic material substrate formed of the ceramics etc. Therefore, a residual stress due to a difference in thermal expansion coefficient acts between the glass lid and the inorganic material substrate, so that the glass lid is peeled from the inorganic material substrate in some cases when a certain time has elapsed after the glass lid is arranged thereon so as to seal the LED element.

It is an object of the invention to provide a semiconductor light-emitting device that prevents the glass lid for sealing the LED element from being peeled or separated from the inorganic material substrate with the LED element mounted thereon, as well as a method for manufacturing the semiconductor light-emitting device.

Solution to Problem

According to an embodiment of the invention, a semiconductor light-emitting device comprises:
a substrate on which a semiconductor light-emitting element is mounted, the substrate having a first coefficient of thermal expansion;
a lid member that covers the semiconductor light-emitting element, the lid member having a second coefficient of thermal expansion smaller than the first coefficient of thermal expansion; and
a joining member that joins the lid member to the substrate to seal the semiconductor light-emitting element, wherein the joining member comprises a eutectic alloy solder.

According to another embodiment of the invention, a method for manufacturing the semiconductor light-emitting device comprises heat-treating an AuSn solder as the eutectic alloy solder at a temperature of 160° C. to 210° C. for a predetermined time.

Effects of Invention

According to an embodiment of the invention, a semiconductor light-emitting device can be provided that prevents the glass lid for sealing the LED element from being peeled or separated from the inorganic material substrate with the LED element mounted thereon, as well as a method for manufacturing the semiconductor light-emitting device.

DESCRIPTION OF EMBODIMENTS

Embodiment

An embodiment of the invention will be described with reference to FIG. 1. The embodiment described below is shown as a preferred specific example for implementing the present invention, and although some technically preferable technical matters are specifically illustrated, the technical scope of the present invention is not limited to this specific embodiment.

Figure 1:
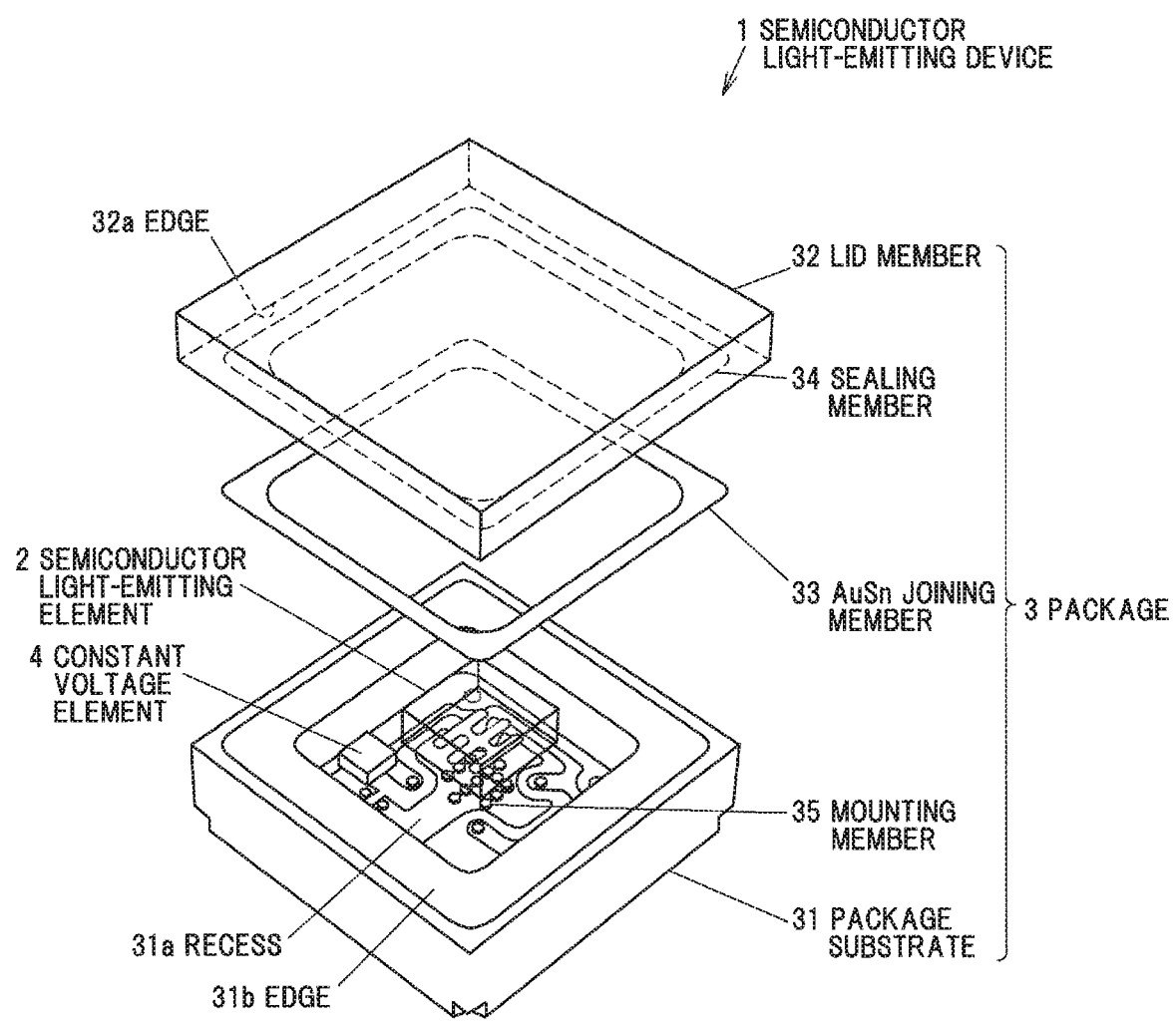
FIG. 1 is an exploded view illustrating a configuration of a semiconductor light-emitting device according to an embodiment of the invention.

FIG. 1 is an exploded view illustrating a configuration of a semiconductor light-emitting device according to an embodiment of the invention. As shown in FIG. 1, a semiconductor light-emitting device 1 includes a semiconductor light-emitting element 2 that emits light in a predetermined wavelength region such as ultraviolet rays and a constant voltage element 4 in which the value of the voltage is constant regardless of the value of the current, and a package 3 for accommodating the semiconductor light-emitting element 2 and the constant voltage element 4.

The semiconductor light-emitting element 2 includes, e.g., a transistor, a laser diode (LD), a light-emitting diode (LED). In the present embodiment, as a semiconductor light-emitting element 2, a light emitting diode that emits light having a wavelength in the ultraviolet region (in particular, a deep ultraviolet light having a central wavelength of not more than 300 nm) will be described as an example. Details of the semiconductor light-emitting element 2 will be described later. As the constant voltage element 4, for example, a Zener diode can be used.

Package 3

The package 3 includes a package substrate 31 constituting a base portion, a lid member 32 joined to the package substrate 31, an AuSn joining member 33 for joining the package substrate 31 and the lid member 32 to each other, a sealing member 34 inserted between a lower surface of the lid member 32 and the AuSn joining member 33, and a mounting member 35 for mounting the semiconductor light-emitting element 2 on the package substrate 31. The AuSn joining member 33 is an example of a joining member.

The package substrate 31 is formed in a substantially rectangular parallelepiped shape and has a recessed portion 31a on the top surface thereof, on which the semiconductor light-emitting element 2 is mounted. The package substrate 31 is an inorganic material substrate including ceramics. Specifically, the package substrate 31 is formed of, e.g., a high-temperature fired ceramic multilayer substrate (HTCC, High Temperature Co-fired Ceramic). The package substrate 31 is an example of a substrate.

The lid member 32 is arranged so as to cover the recess 31a of the package substrate 31. The lid member 32 is, e.g., a glass lid including quartz glass. An edge 32a of a lower surface of the lid member 32 and an edge 31b of an upper surface of the package substrate 31 are in surface contact with each other by soldering by the AuSn joining member 33 so that the lid member 32 and the package substrate 31 are joined and integrated, and the internal space formed by the lid member 32 and the package substrate 31 is hermetically sealed from the outside. Further, on the quartz glass, a metallized film (not shown, hereinafter also referred to as "laminated metallization") of a laminated structure to temporarily attach an AuSn solder preform to be described later is formed. As an example, the laminated metallization has a substantially square external shape with one side of about 3.0 mm.

The AuSn joining member 32 seals the semiconductor light-emitting element 2 by covering the lid member 32 with the semiconductor light-emitting element 2 and joins the lid member 32 to the package substrate 31. Specifically, the AuSn joining member 33 joins the package substrate 31 and the lid member 32 by soldering. The AuSn joining member 33 is, e.g., an alloy containing gold (Au) and tin (Sn) as main components, and constitutes a solder preform used for soldering. More specifically, the AuSn joining member is, e.g., an AuSn solder preform containing 20% Au. As an example, the AuSn solder preform has a substantially square external shape with one side of about 3.0 mm.

Hereinafter, for convenience of description, the thermal expansion coefficient of the package substrate 31 is also referred to as "first thermal expansion coefficient". The thermal expansion coefficient of the lid member 32 is also referred to as "second thermal expansion coefficient". The second coefficient of thermal expansion is about 1 order of magnitude smaller than the first coefficient of thermal expansion.

The sealing member 34 is a filling material provided between the lower surface of the lid member 32 and the AuSn joining member 33.

For the mounting member 35, e.g., stud bumps can be used. Soldering or lead pins may be used. The semiconductor light-emitting element 2 is mounted on the bottom surface of the recess 31a by the mounting member 35.

Semiconductor Light-Emitting Element 2

Figure 2:
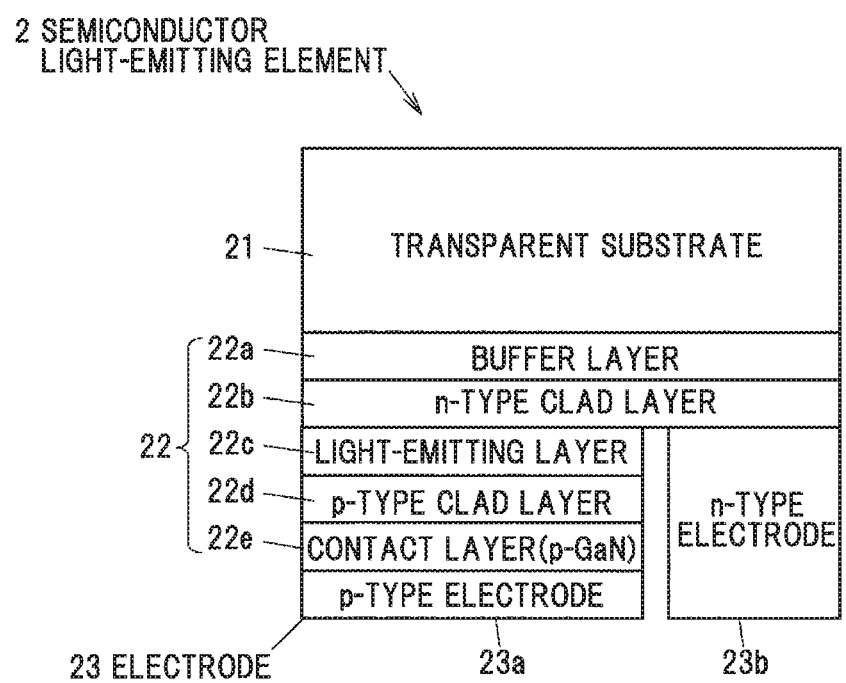
FIG. 2 is an explanatory view schematically showing an example of a laminated structure of a semiconductor light-emitting element.

FIG. 2 is an explanatory view schematically showing an example of a laminated structure of the semiconductor light-emitting element 2 included in the semiconductor light-emitting device 1 shown in FIG. 1. As shown in FIG. 2, the semiconductor light-emitting element 2 according to the present embodiment includes a transparent substrate 21, an AlGaN-based nitride semiconductor layer 22 formed on the transparent substrate 21, and an electrode 23.

In the present embodiment, the nitride semiconductor layer 22 is formed by a buffer layer 22a containing AlN, an n-type clad layer 22b containing n-type AlGaN, and a light-emitting layer 22c containing AlGaN, a p-type cladding layer 22d containing p-type AlGaN, and a contact layer 22e containing p-type GaN from the transparent substrate 21 side. The electrode 23 has an anode side electrode portion (p-type electrode) 23a formed on a contact layer 22e and a cathode side electrode portion (n-type electrode) 23b formed on a n-type clad layer 22b. Note that a dimension ratio of each component in FIG. 2 does not necessarily coincide with an actual size ratio of the semiconductor light-emitting device.

Mounting of the Semiconductor Light-Emitting Device 1 on the Mounting Substrate

Figure 3:
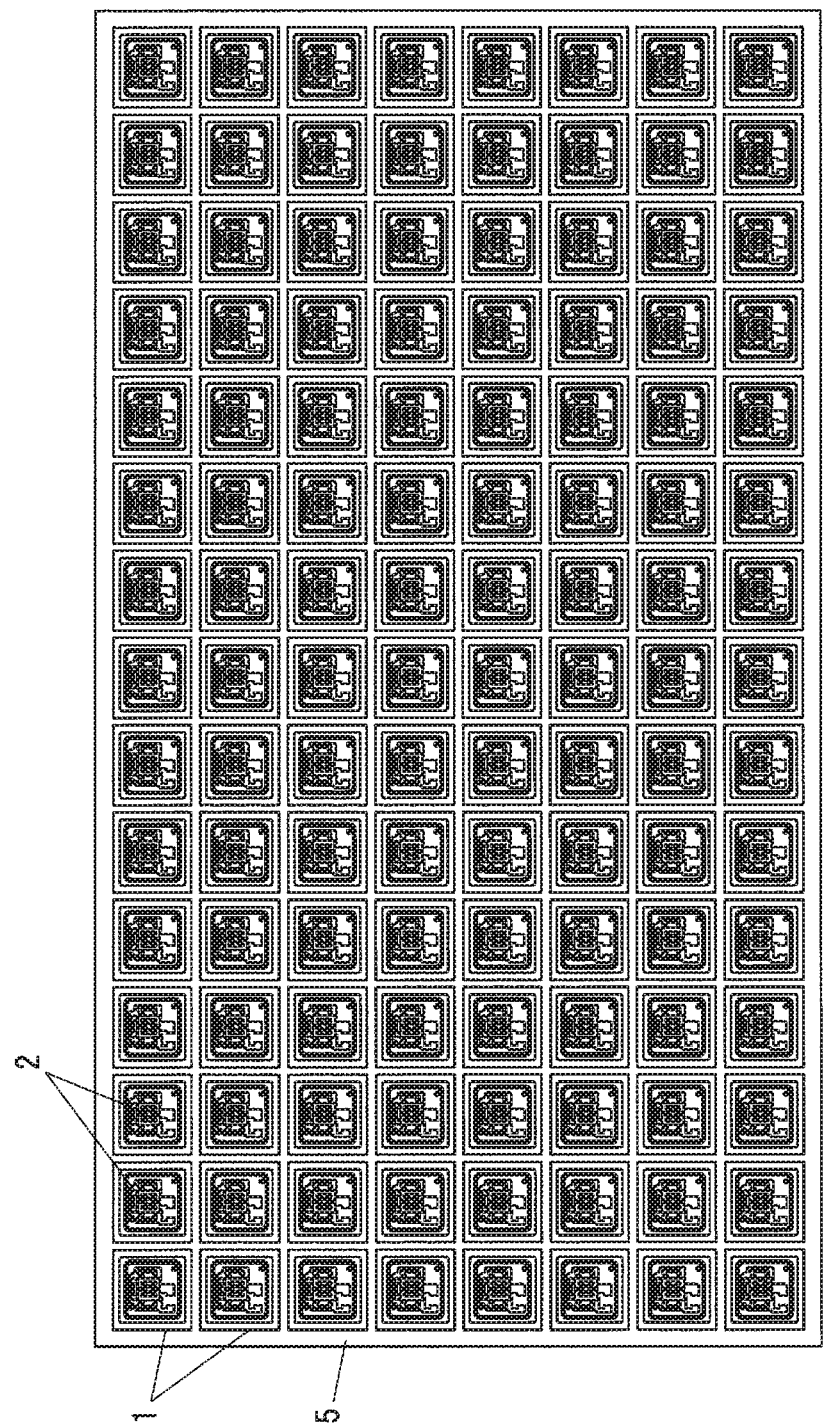
FIG. 3 is an explanatory view showing an example of mounting of a semiconductor light-emitting device on a mounting substrate.

FIG. 3 is an explanatory view showing an example of mounting of the semiconductor light-emitting device 1 on the mounting board. As shown in FIG. 3, a total of 120 semiconductor light-emitting devices 1 are mounted on the mounting substrate 5 in eight rows (a vertical direction in FIG. 3) and 15 rows (a lateral direction in FIG. 3). An interval between adjacent semiconductor light-emitting devices 1 is adjusted to about 1 mm 8 rows and 15 columns (120 pieces) are examples, and the number of the semiconductor light-emitting devices 1 mounted on the mounting board 5 is not limited to 8 rows and 15 columns (120 pieces). The mounting board 5 is configured to include copper (Cu) as a main component, e.g.

Figure 4:
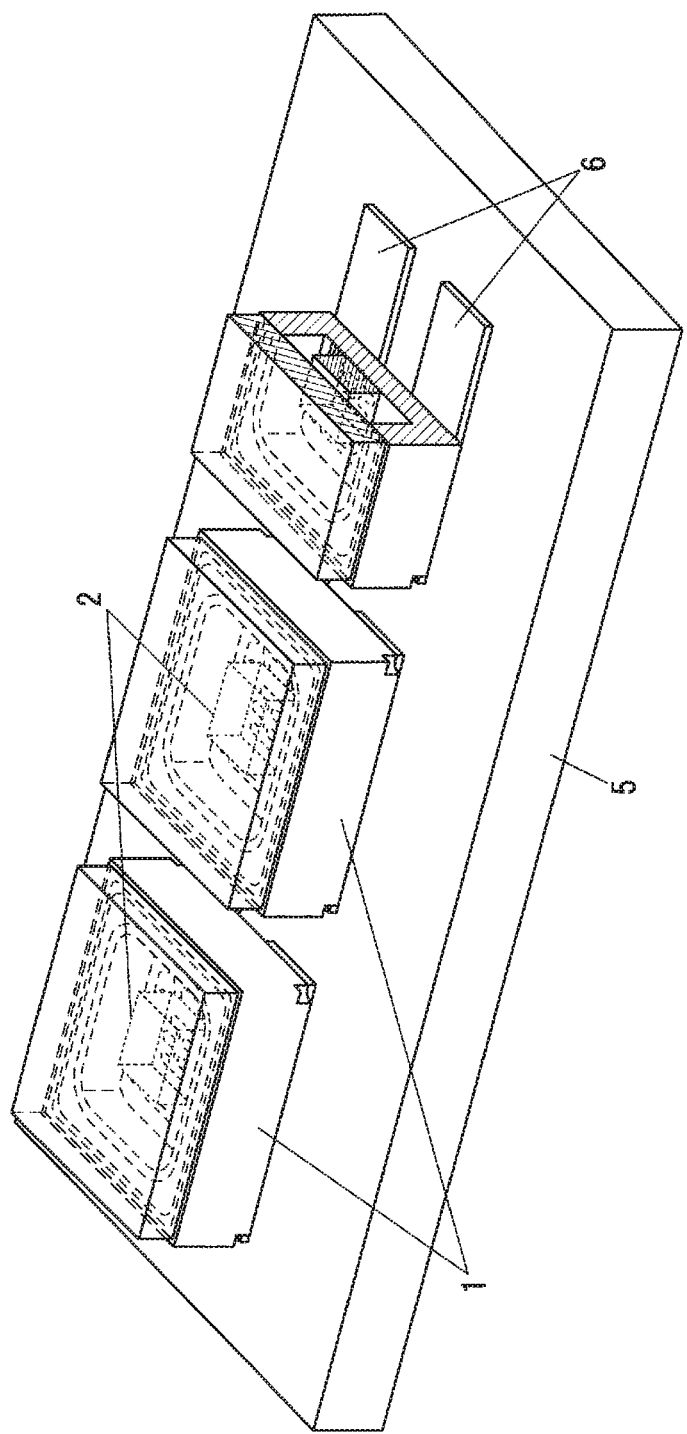
FIG. 4 is an explanatory diagram illustrating a part of a mounting of the semiconductor light-emitting device shown in FIG. 3.

Details of mounting of the semiconductor light-emitting device 1 on the mounting board 5 will be described with reference to FIG. 4. FIG. 4 is an explanatory view explaining a part of the mounting from the semiconductor light-emitting device 1 shown in FIG. 3. As shown in FIG. 4, the semiconductor light-emitting device 1 is fixed to the mounting substrate 5 by soldering, e.g., by a lead-free solder 6 containing no lead. For the lead-free solder 6, e.g., a tin-silver-copper solder preform containing tin (Sn), silver (Ag) and copper (Cu) as a main component can be used.

The semiconductor light-emitting device 1, that is, the package 3 in which the semiconductor light-emitting element 2 is accommodated, is annealed for a predetermined time before mounting on the mounting board 5. An annealing process refers to a step of leaving at a high temperature. The predetermined time is preferably 12 hours. The annealing process is an example of heat-treating.

Experiment of Implementation

The inventors conducted experiments to check whether or not the lid member 32 formed of quartz glass peels from the package substrate 31 in the above-described mounting in this embodiment when the semiconductor light-emitting device 1 is annealed, in order to investigate that the lid member 32 made of quartz glass is less likely to peel off from the package substrate 31.

Experiment 1

Figure 5:
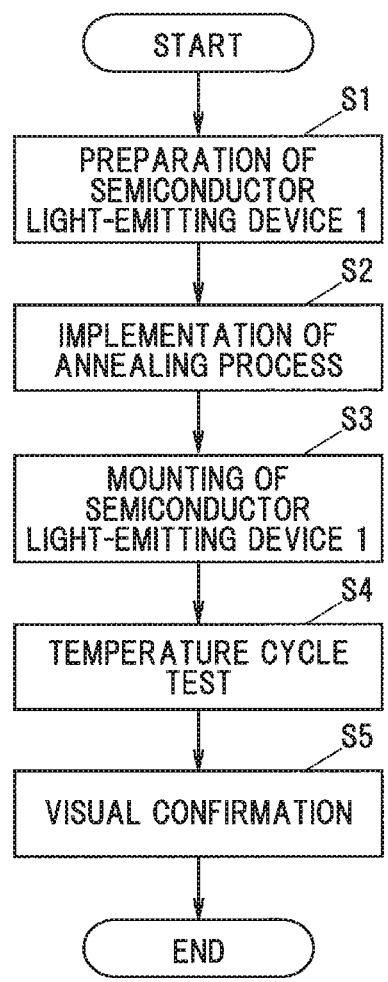
FIG. 5 is a flowchart showing a procedure of an experiment.

First, the inventors applied an annealing process to the semiconductor light-emitting device 1, mount the semiconductor light-emitting device 1 on the mounting substrate 5, and check whether or not the lid member 32 peels off from the package substrate 31. The details of the experiment will be explained with reference to FIG. 5. FIG. 5 is a flowchart showing a procedure of the experiment. First, the inventors prepared 120 semiconductor light-emitting devices 1 (S1). Experiment 1 is a preliminary test of Experiment 2 to be described later, and a semiconductor light-emitting device 1 in a state in which the lid member 32 is easily peeled from the package substrate 31 is prepared as compared with Experiment 2.

Here, in order to peel easily the lid member 32 from the package substrate 31, the following configuration was adopted. In other words, external dimensions of the metallized-pattern of a laminated metallized film are made smaller than external dimensions of the AuSn solder preform (substantially square with about 3.0 mm on one side). Thus, a joining strength of the package substrate 31 is made smaller than a predetermined joining strength. Specifically, a combination of a first laminated metallized film for AuSn solder connection and a second laminated metallized film for solder connection of a ceramic package (not shown) with a size equal to outer dimensions of the first laminated was used as the laminated metallized film formed on the quartz glass of the lid member 32. Then, in a state of no load, the AuSn solder preform was melted and the lid member 32 and the package substrate 31 were joined. The second laminated metallized film has a property of shrinking by firing. Therefore, by using the laminated metallized film in which the second metallized film is combined, the external dimensions of the laminated metallized film are reduced at the time of joining, whereby the joining strength of the package substrate 31 can be made smaller than the predetermined joining strength.

Next, the semiconductor light-emitting device 1 was annealed in an air atmosphere for 12 hours under the conditions of 160, 180, 200 and 220 degrees (S2). Next, the semiconductor light-emitting device 1 was mounted on the mounting substrate 5 by using the lead-free solder 6 (S3). Next, a temperature cycle test of repeating change of temperature in the range of −40° to 85° with respect to the semiconductor light-emitting device 1 was performed for 1000 cycles (S4). Next, peeling of the lid member 32 (quartz glass) from the package substrate 31 was visually confirmed (S5). In addition, in the case of referring to the temperature, "degree" means degrees Celsius (° C.).

Figure 6:
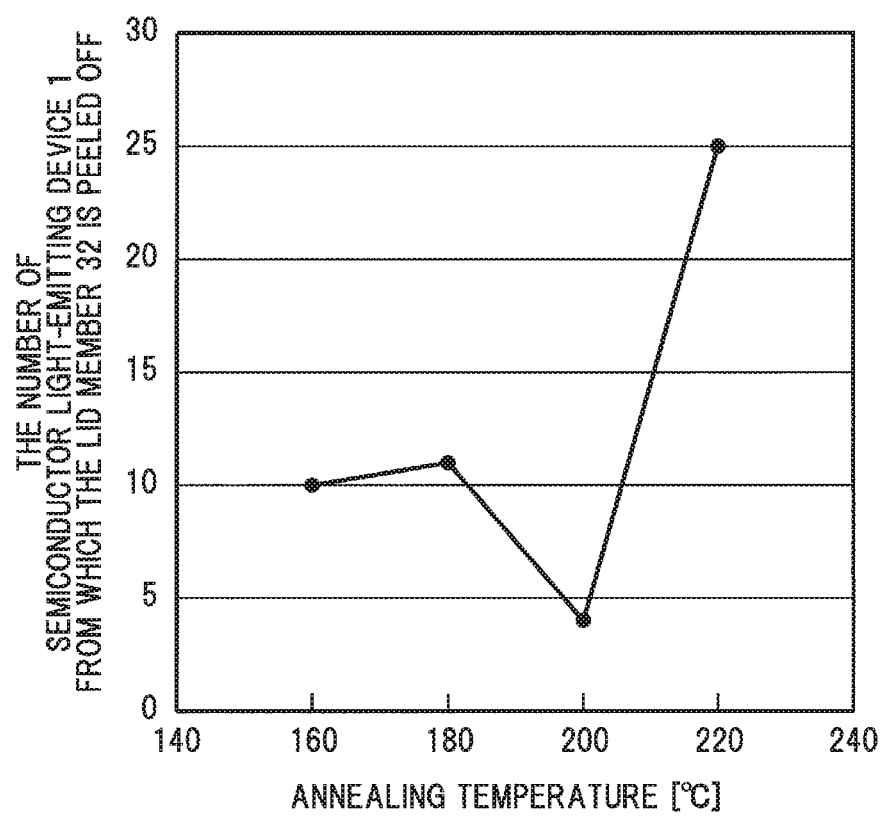
FIG. 6 is a graph showing the results of visually confirming peeling of the lid member.

FIG. 6 is a graph showing the results of visually confirming peeling of the lid member. The horizontal axis in FIG. 6 means a temperature (degree) (hereinafter also referred to as "annealing temperature") at which an annealing process was implemented, and the vertical axis means the number (hereinafter also referred to as "peeling number") of the semiconductor light-emitting devices 1 from which the lid member 32 is peeled off.

Figure 7:
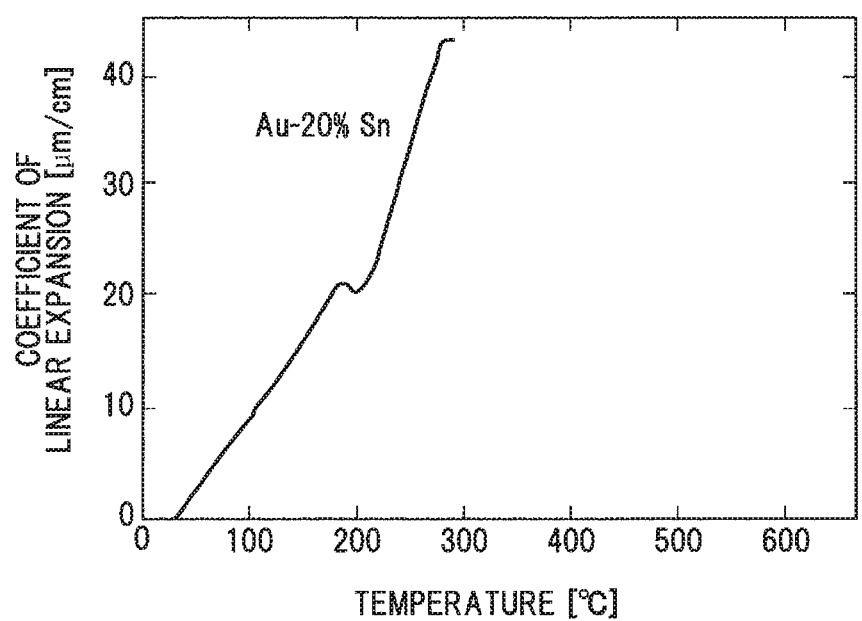
FIG. 7 is a diagram showing the relationship between the temperature and the linear expansion coefficient of the AuSn joining member.
Figure 8:
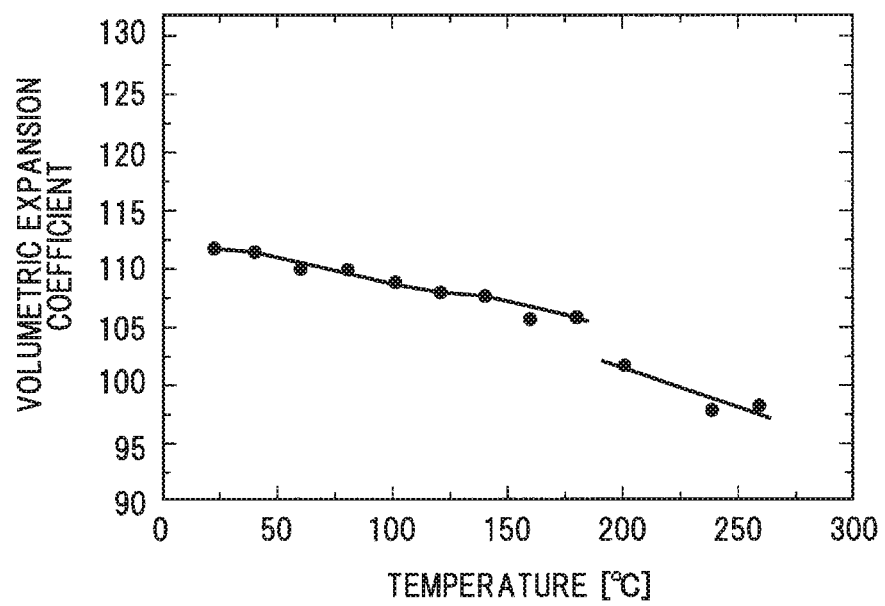
FIG. 8 is a diagram showing the relationship between the temperature and the volumetric expansion coefficient of the AuSn joining member.

FIG. 7 is a diagram showing a relationship between a temperature and a linear expansion coefficient of the AuSn joining member. FIG. 8 is a diagram showing a relationship between a temperature and a volume expansion coefficient of the AuSn joining member. FIGS. 7 and 8 are cited excerpts from Microelectronics Reliability 52 (2012) 1306-1322. FIGS. 7 and 8 corresponds to a and b in FIG. 9 disclosed in the document. In addition, in FIGS. 7 and 8, the information not used in this specification is deleted from a and b in FIG. 9 of the document and the contents of the English notation is translated into Japanese.

As shown in FIG. 6, the peeling number was minimized when the annealing temperature was 200 degrees. The AuSn joining member 33 used here has a composition ratio of Au of 20% (hereinafter also referred to simply as "Au-20%"), and a balance is a eutectic alloy solder of Sn. The melting point of this composition is lower than a melting points of the elements of Au and Sn (about 1064 degrees and 239.1 degrees, respectively). It was confirmed that the residual stress caused by the difference in thermal expansion coefficient between the lid member 32 and the package substrate 31 was sufficiently released by the annealing process at 200° C. for 12 hours, and the peeling of the lid member 32 could be most suppressed after the lid member 32 made of quartz glass and the package substrate 31 formed of ceramics are joined by the AuSn joining member 33 in FIG. 6, where the 200° C. is a minimum point of a temperature-to-linear expansion coefficient of the AuSn joining member 33 shown in FIG. 7 and a discontinuous point of a temperature-to-volume expansion ratio of the AuSn joining member 33 shown in FIG. 8. It was confirmed that those annealed at 200 degrees for 12 ours can sufficiently release the residual stress and most suppress peeling of the lid member 32. The mechanism of releasing the above residual stress is currently being studied, but it is unknown for now.

As apparent from FIG. 6, It was confirmed that the residual stress was most released at the annealing temperature at the above-mentioned 200° C. Further, it was confirmed that a predetermined effect can be obtained even in the range of 160 degrees to 210 degrees. Note that the AuSn joining member 33 can be replaced with another eutectic solder member.

Experiment 2

Next, the inventors conducted experiments on another 120 semiconductor light-emitting devices 1 in the same procedure (steps S1 to S5) as in Experiment 1 described above. In Experiment 2, the semiconductor light-emitting device 1 in which the lid member 32 and the package substrate 31 were joined with a predetermined strength as compared with Experiment 1 was prepared. In step S2, the annealing process was performed at 200 degrees which was most effective for releasing the residual stress. In addition, in step S4, the number of times of the temperature cycle test was 2000 cycles.

As a result, after the temperature cycle, it was confirmed that there was no semiconductor light-emitting device 1 from which the lid member 32 (quartz glass) was peeled off from the package substrate 31.

Experiment 3 (Comparative Example)

Next, the inventors investigated whether or not the lid member 32 peels off from the package substrate 31 in the example in which the semiconductor light-emitting device 1 is mounted on the mounting substrate 5 without implementing the annealing process on the semiconductor light-emitting device 1 as a comparative example. Specifically, in the above-described steps, experiments were carried out in a procedure excluding Step 2, Step 5, and Step 6. The semiconductor light-emitting device 1 is prepared (S1), the semiconductor light-emitting device 1 is mounted on the mounting substrate 5 (S3), 1000 cycles of the temperature cycle test are performed on the semiconductor light-emitting device 1 (S4), and the peeling of the lid member 32 (quartz glass) was visually confirmed (S5).

As a result, in the sixteen semiconductor light-emitting devices 1 corresponding to approximately 13% of the total 120 pieces, the lid member 32 peeled off from the package substrate 31, when mounting substrate 5 is stored at room temperature (e.g., 25 degrees) for 14 days in a state where semiconductor light-emitting device 1 is mounted. Further, when the mounting substrate 5 was continuously stored at room temperature (e.g., about 6 months), the lid member 32 peeled from the package substrate 31 in 120 semiconductor light-emitting devices 1 corresponding to the total number.

Effects of the Embodiment

As described above, the semiconductor light-emitting device 1 according to the embodiment of the invention includes the semiconductor light-emitting element 2 and the package 3 that houses the semiconductor light-emitting element 2, and the package 3 includes a package substrate 31 on which the semiconductor light-emitting element 2 is mounted, the lid member 32 formed of glass, and a joining member for joining the package substrate 31 and the lid member 32. The joining member is a joining member that releases the residual stress based on the difference in thermal expansion coefficient between the joining member and the lid member of the package substrate 31. As a result, the residual stress caused by the difference in thermal expansion coefficient between the lid member 32 and the package substrate 31 is released, and the peeling of the lid member 32 from the package substrate 31 can be suppressed.

Summary of Embodiments

Next, the technical concept that is ascertained from the embodiments described above will be described with the aid of the reference characters and the like in the embodiment. It should be noted, however, that each of the reference characters in the following description should not be construed as limiting the constituent elements in the claims to the members and the like specifically shown in the embodiments.

[1] A semiconductor light-emitting device (1), comprising: a substrate (32) on which a semiconductor light-emitting element (2) is mounted, the substrate (32) having a first coefficient of thermal expansion; a lid member (32) that covers the semiconductor light-emitting element (2), the lid member (32) having a second coefficient of thermal expansion smaller than the first coefficient of thermal expansion; and a joining member (33) that joins the lid member (32) to the substrate (32) to seal the semiconductor light-emitting element (2), wherein the joining member (33) comprises a eutectic alloy solder.

[2] The semiconductor light-emitting device (1) according to [1], wherein the substrate comprises an inorganic material substrate comprising a ceramics, wherein the lid member (32) comprises a glass lid comprising a silica glass, and wherein the eutectic alloy solder comprises an AuSn solder.

[3] The semiconductor light-emitting device (1) according to [2], wherein the AuSn solder comprises 20% of Au.

[4] A method for manufacturing the semiconductor light-emitting device (1) according to [2] or [3], comprising heat-treating the AuSn solder at a temperature of 160° C. to 210° C. for a predetermined time.

[5] The method for manufacturing the semiconductor light-emitting device (1) according to [4], wherein the AuSn solder is heat-treated at 200° C. for 12 hours.

The invention claimed is:

1. A semiconductor light-emitting device, comprising:
    an inorganic material substrate comprising a ceramic, the inorganic material substrate having a semiconductor light-emitting element mounted thereon, the inorganic material substrate having a first coefficient of thermal expansion;
    a glass lid that comprises a silica glass, wherein the glass lid is configured to cover the semiconductor light-emitting element, the glass lid having a second coefficient of thermal expansion smaller than the first coefficient of thermal expansion; and
    a joining member that comprises a heat-treated AuSn eutectic solder comprising 20% Au and heat-treated at a temperature of 160° C. to 210° C. for a predetermined time, the heat-treated AuSn eutectic solder joining the glass lid to the inorganic material substrate to seal the semiconductor light-emitting element.

2. A method for manufacturing a semiconductor light-emitting device, comprising:
    an inorganic material substrate comprising a ceramic, the inorganic material substrate having a semiconductor light-emitting element mounted thereon, the inorganic material substrate having a first coefficient of thermal expansion;
    a glass lid comprising a silica glass, wherein the glass lid is configured to cover the semiconductor light-emitting element, the glass lid having a second coefficient of thermal expansion smaller than the first coefficient of thermal expansion; and
    a joining member that comprises an AuSn eutectic solder comprising 20% Au, the joining member loins the glass lid to the inorganic material substrate to seal the semiconductor light-emitting element,
    the method comprising:
    heat-treating the AuSn solder at a temperature of 160° C. to 210° C. for a predetermined time.

3. The method for manufacturing the semiconductor light-emitting device according to claim 2, wherein the AuSn solder is heat-treated at 200° C. for 12 hours.

4. A semiconductor light-emitting device, comprising:
    an inorganic material substrate comprising a ceramic, the inorganic material substrate having a semiconductor light-emitting element mounted thereon, the inorganic material substrate having a first coefficient of thermal expansion;
    a glass lid comprising a silica glass, wherein the glass lid is configured to cover the semiconductor light-emitting element, the glass lid having a second coefficient of thermal expansion smaller than the first coefficient of thermal expansion; and
    a joining member that comprises a eutectic alloy solder, wherein the eutectic alloy solder is configured to release a residual stress that remains in the joining member due to a difference between the first coefficient of thermal expansion and the second coefficient of thermal expansion.

5. The semiconductor light-emitting device, according to claim 4, wherein the eutectic alloy solder comprises an AuSn eutectic solder.

6. The semiconductor light-emitting device, according to claim 5, wherein the AuSn eutectic solder comprises 20% Au.

7. The semiconductor light-emitting device, according to claim 6, wherein the AuSn eutectic solder is a heat-treated AuSn eutectic solder comprising 20% Au and heat-treated at a temperature of 160° C. to 210° C. for a predetermined time.

* * * * *